United States Patent

[11] 3,612,955

[72] Inventors Alexander D. Butherus
Murray Hill;
Miles C. Huffstutler, Jr., Watchung; Jack A. Morton, South Branch, all of N.J.
[21] Appl. No. 792,487
[22] Filed Jan. 21, 1969
[45] Patented Oct. 12, 1971
[73] Assignee Bell Telephone Laboratories, Incorporated
Murray Hill, N.J.

[54] CIRCUIT BOARD CONTAINING MAGNETIC MEANS FOR POSITIONING DEVICES
1 Claim, 4 Drawing Figs.

[52] U.S. Cl. ........ 317/101 A, 317/235, 29/589, 29/471.1, 317/101 CC
[51] Int. Cl. ........ H01h 3/14
[50] Field of Search ........ 317/101, 101 A, 101 CC, 101 CP; 339/12; 29/626, 589, 471.1

[56] References Cited
UNITED STATES PATENTS 3,061,816 10/1962 Reynolds ........ 317/101 CP UX
3,205,407 9/1965 Thompson ........ 339/12 X

FOREIGN PATENTS 128,831 9/1948 Australia ........ 339/12
974,153 9/1960 Germany ........ 339/12

OTHER REFERENCES

Horchos, " Test Socket," IBM Tech. Disclosure Bull., Vol. 6., No. 6, November 1963, p. 39 (copy 339-12).
Horchos, " Magnetic Jigs Simplify Diode Measurements," Electrical Design News, December 1963, p. 44, 45, (copy 339-12).

*Primary Examiner*—David Smith, Jr.
*Attorneys*—R. J. Guenther and Edwin B. Cave

ABSTRACT: Ferromagnetic materials are incorporated into circuit boards in accordance with predetermined patterns to enable by magnetic attraction substantially automatic positioning on the boards of semiconductor devices containing ferromagnetic material distributed therein in configurations to match the material in the circuit boards.

INVENTORS A. D. BUTHERUS
M. C. HUFFSTUTLER, JR.
J. A. MORTON
BY H. W. Lockhart
ATTORNEY

CIRCUIT BOARD CONTAINING MAGNETIC MEANS FOR POSITIONING DEVICES

This invention relates to the assembly of electronic apparatus and particularly to means for positioning semiconductor devices on mounting boards.

Current technology has provided for the mounting of solid-state circuit elements such as integrated semiconductor devices as well as discrete semiconductor devices directly upon mounting boards without the use of the metal or metal and glass encapsulations heretofore necessary. In particular, the development of suitable protective coatings and films for both mechanical and electrical protection of semiconductor devices has resulted in structures in which the semiconductor chips themselves are directly connected to circuit patterns on mounting boards. This has produced a further miniaturization of electronic apparatus and has increased the difficulty of fabricating such apparatus. Moreover, the devices and mounting boards are smaller, somewhat more fragile and they involve a considerably greater functional density than in prior art structures. That is, a small semiconductor integrated circuit element may be, at most, 100 mils in width or length and yet have anywhere from 12 to 24 or more external lead connections. Consequently, it is apparent that the mounting of such semiconductor devices on mounting boards for interconnection to circuits requires great accuracy and precise handling and of positioning. At the present time the general practice is to move the semiconductor devices more or less individually using manually operated pickup tools, typically of the vacuum-type. Such operations are conducted by operators using microscopes in order to assure proper positioning of interconnecting leads having widths of the order of several mils with spacings therebetween of the same or smaller dimensions.

Accordingly, it is an object of this invention to provide more facile means for the positioning of semiconductor devices on mounting boards or other interconnecting substrates. In particular it is an object of this invention to reduce the amount of manual operation required for typical electronic apparatus involving semiconductor devices.

In accordance with this invention the mounting boards or substrates incorporate within the board, or underlying circuit pattern, or, as a part of the circuit pattern, ferromagnetic material distributed in accordance with a particular pattern. This pattern is related to the positioning of the individual semiconductor devices on the circuit board. Thus, ferromagnetic material is likewise included within the semiconductor devices so that the devices are attracted to the locations on the mounting board at which they are to be permanently affixed. The term "ferromagnetic" as used herein is defined as relating to a class of substances characterized by abnormally high magnetic permeability, definite saturation point, and appreciable residual magnetism and hysteresis.

By asymmetric distributions and particular polarizations in connection with location of magnetic material within the semiconductor devices and the mounting board, devices of different types may be attracted to and retained at particular locations upon the board and, moreover, individual devices may be correctly aligned and oriented to the conductive pattern on the mounting board.

In one general aspect, this invention involves incorporation in mounting boards of ferromagnetic material of both hard and soft type as well as of the range between. In this context "-hard" refers to material having relatively high values of the energy product $(BH)_{max}$, typically about 10 million gauss-oersted while the "soft" or so-called highly permeable material refers to materials such as the high nickel content iron alloys having energy products of considerably less than one million gauss-oersted.

Further, in the practice of this invention hard materials located in the mounting boards may be substantially permanently, in the time sense, magnetized preceding the assembly of semiconductor devices to the boards. On the other hand, if soft materials are used, an externally driven magnetomotive force may be coupled to the ferromagnetic material in the board only during the assembly operation.

Thus, in accordance with the invention, by provision of magnetic means within the substrate or mounting board the semiconductor devices to be mounted thereon may be fed to the board surface and precisely positioned by the magnetic attraction provided therebetween. Reference is made to the concurrently filed application of Hughes-Morton-Wachs, Ser. No. 792,490, assigned to the same assignee as this application.

The invention and its other objects and features will be more clearly understood from the following detailed description taken in conjunction with the drawing in which.

Figure 1:
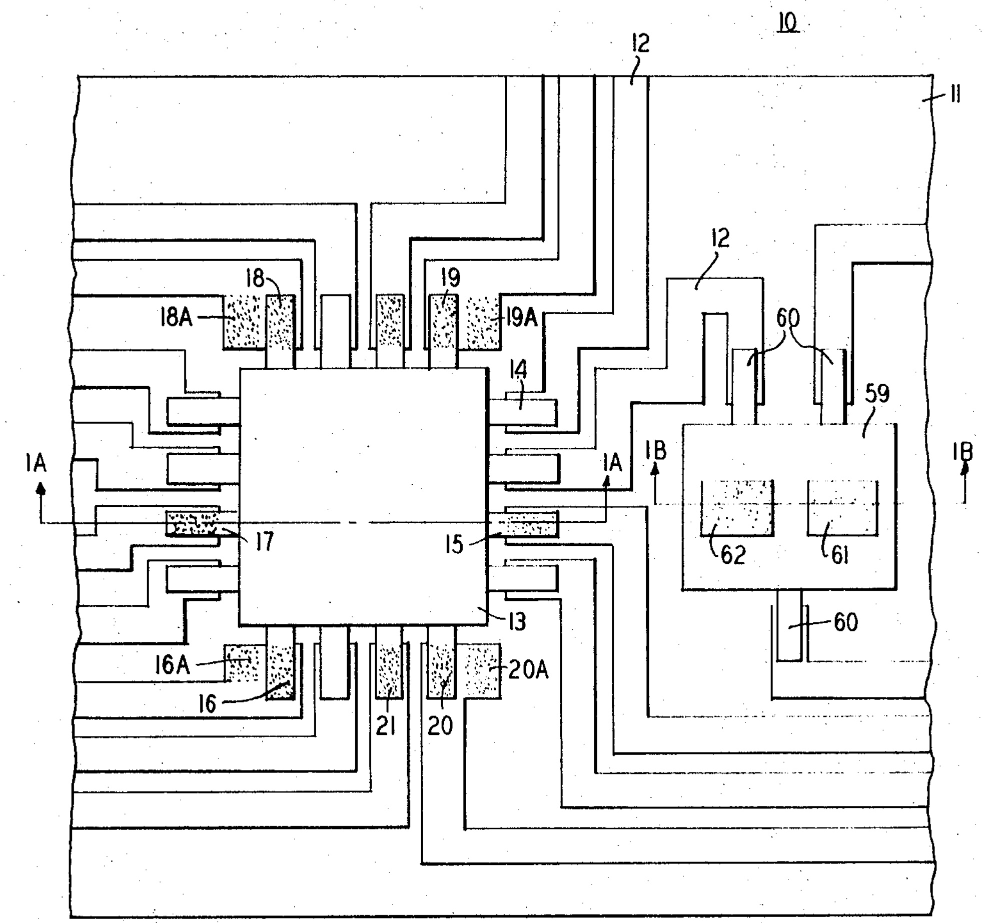
FIG. 1 is a plan view of a part of a mounting board containing portions of a conductive pattern having semiconductor devices of the beam lead type mounted thereto.

FIG. 1 shows an assembly 10 comprising a mounting board 11 having a conductive pattern on the surface thereof comprising conductive metal strips 12 formed on the board surface. It will be understood that the apparatus specifically described is purely exemplary and that although the board may be described as comprising an organic dielectric having copper foil circuits, it may well also be comprised of a ceramic wafer having a conductive pattern consisting of deposited gold films. Moreover, the drawings are not to scale and the dimensions in certain respects are considerably exaggerated in order to clarify the explanation and therefore the understanding of the invention.

Mounted on the circuit board is a semiconductor device 13 which may comprise an integrated circuit device including a considerable number of transistors, diodes, resistors and the like. There is also shown a semiconductor device 19 on the mounting board which may be taken as a discrete transistor. Both the device 13 and the device 19 are shown having beam leads for interconnection of the device terminals to the conductive pattern on the mounting board. These beam leads are of the type described in patent 3,335,338 granted Aug. 8, 1967 to M. P. Lepselter. It will be understood that the invention may be applied likewise to semiconductor devices having other interconnection arrangements, although it is most advantageously applied to the beam lead structure.

Referring particularly to the semiconductor device 13, the device is shown as having sixteen symmetrically arranged beam leads 14. Each lead is shown overlaying a terminal portion of a conductive strip 12. Typically, the device is affixed to the mounting board by bonding of the beam lead 14 to the conductive strip 12, for example, by thermocompression bonding. Obviously there are a variety of alternative bonding techniques suitable for this particular step. The semiconductor element 19 having beam leads 20 is affixed to the mounting board in similar fashion.

Figure 1A:
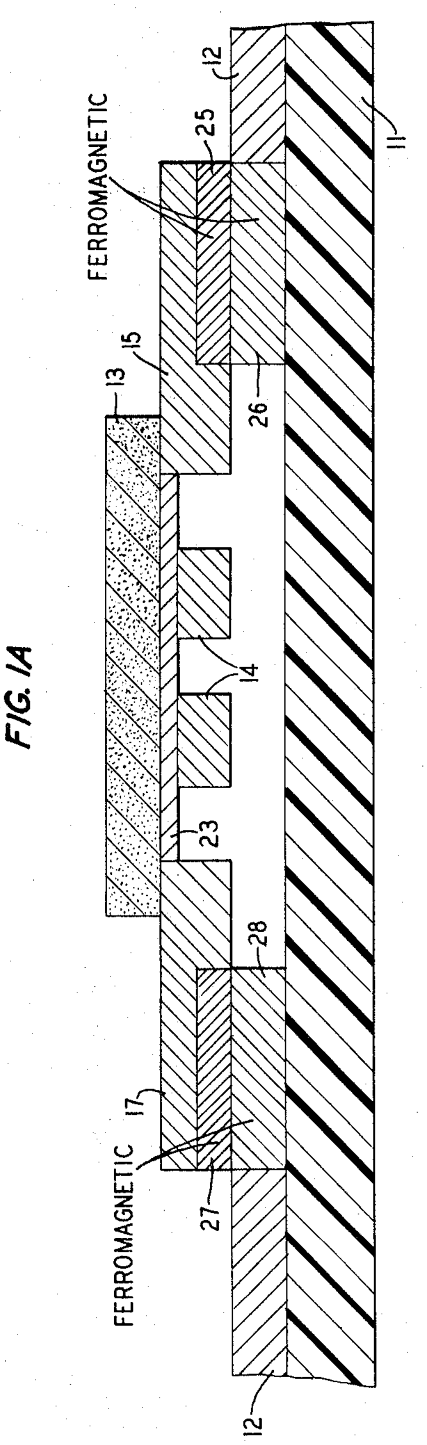
FIGS. 1A and 1B are sectional views of each of the semiconductor devices of FIG. 1 mounted on the circuit board.
Figure 1B:
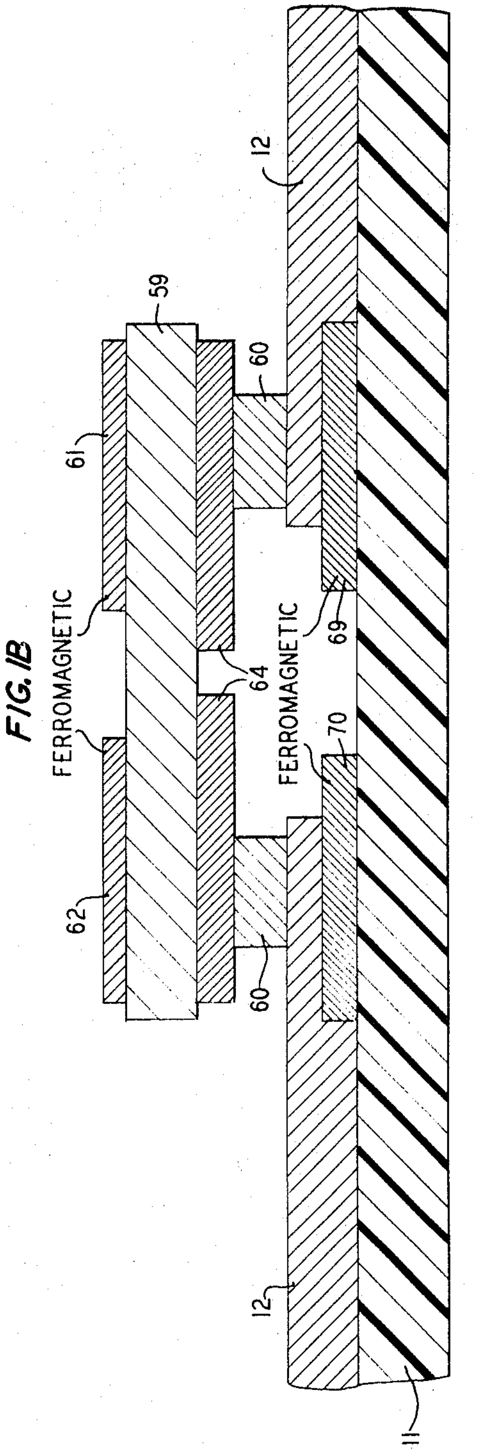

FIGS. 1A and 1B show in sectional views further detail in connection with the positioning and affixing of the semiconductor devices 13 and 19 to the mounting board 11. It should be noted that the distortion of the beam leads accompanying a thermocompression bonding operation is not represented in the drawings for the sake of clarity. Referring again to FIG. 1, eight of the beam leads of the semiconductor device 13, denoted 15, 16, 17, 18, 19, 20, 21 and 22 are represented by a stippled pattern. This effect in the drawing represents the presence within the beam lead and in the portion of the conductive strip 12 beneath and adjacent to the beam lead of ferromagnetic material. It will be appreciated that in actually viewing the device 13 there may not be any apparent difference in the various beam leads indicating the incorporation in each of magnetic material. In particular, the material may be incorporated within the beam leads in accordance with techniques described in the above-identified application of Hughes-Morton-Wachs. In the particular case shown the magnetic material is incorporated asymmetrically in certain of the beam leads so as to insure the proper orientation of the semiconductor device as it is drawn to the mounting location on the surface of the board.

More particularly, ferromagnetic material is incorporated in the mounting board so as to produce magnetic attraction both laterally and vertically. Thus, in exemplary fashion, offset portions 16A, 18A, 19A and 20A of the conductive strip include ferromagnetic material to exert magnetic forces having horizontal components. It is advantageous to provide forces in lateral directions in addition to vertical forces between the materials in the other beam leads 15, 17, 21 and 22 so as to counteract frictional forces between the contacting surfaces which might inhibit precise positioning.

Moreover, offset magnetic segments such as portions 16A, 18A, 19A and 20A may comprise advantageously shaped permanent magnets. As is known in the art configurations may be provided for enhancing the magnetic fields so as to achieve maximum force and direction.

Referring to FIG. 1A in which like reference numerals are applied where appropriate, the beam lead 15 is shown having a portion 25 containing ferromagnetic material and the beam lead 17 a similar ferromagnetic portion 27. Cooperating with these magnetic portions are portions 26 and 28 which may be extensions of the conductive strips 12 comprising ferromagnetic material of the permanent type which has been suitably magnetized during manufacture. Thus, each portion 26 and 28 will comprise a north and south end as in the case of a magnet. The attraction exerted by these magnets is sufficient to draw the beam leads 15 and 17 to the position shown on the mounting board surface. By way of further description the layer 23 shown on the under surface of the semiconductor body 13 comprises a metallic interconnection pattern applied to the device face of the semiconductor body 13.

In an alternative situation, if the asymmetry provided by the particular distribution of magnetic material in the beam leads as shown on body 13 is not available by reason of the lack of sufficient number of beam leads or for some other reason, orientation of the device 13 may be achieved by using permanent magnetic material in the beam leads and magnetizing this material in a manner so as to cooperate with the magnetization already provided in the substrate.

Such a scheme of utilizing permanent magnetic material in both the substrate and the semiconductor device is illustrated in FIG. 1B showing a sectional view of the semiconductor device 59. In this particular example, layers 69 and 70 of the ferromagnetic material are provided on the board surface, each containing a north and a south pole in a particular orientation. The semiconductor device 59 likewise has on the back surface thereof layers 61 and 62 of magnetic material polarized so as to result in an attractive force between the layers 69 and 70 on the board and the layers 61 and 62 on the device. It will be appreciated that polarization is accomplished so as to insure proper orientation of the semiconductor device on the mounting board.

Figure 2:
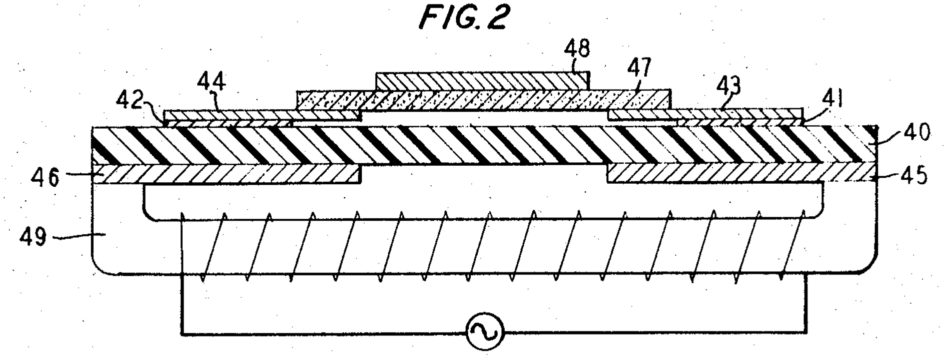
FIG. 2 is another embodiment showing the use of an externally coupled magnetomotive force.

In the arrangement shown in the sectional view in FIG. 2, a mounting board 40 has strips 45 and 46 of soft magnetic material on one surface. Mounted on the other surface in a beam leaded semiconductor device comprising the semiconductor wafer 47 having beam leads 43 and 44 affixed to the conductive strips 41 and 42 respectively on the mounting board 40. On the upper face of the wafer 47 is a strip 48 of ferromagnetic material which enables the location and retention of the semiconductor device when the electromagnet 49 is applied to the strips 45 and 46 and energized. Recognizing the exaggeration in the thickness dimensions proportionally in the drawing, it will be appreciated that a magnetic circuit is formed which the strip 48 on the semiconductor device completes by occupying the gap between strips 45 and 46. After the semiconductor device is permanently bonded the electromagnet 49 is removed. It will be appreciated that electromagnetic jigs may be arranged for accomplishing apparatus board assembly using this concept. Moreover, it may be advantageous for assembly purposes to incorporate in the electromagnetic means for producing vertically disposed magnetic fields of an alternating or pulsating character. That is, by the provision of separate cores and windings and the application of an alternating or pulsating current a slight vertical movement of the circuit elements on the board may be induced to enable more facile positioning.

In connection with the foregoing references to ferromagnetic materials the following are examples of useful materials of both soft (low $BH_{max}$) and hard (high $BH_{max}$) type.

| Alloy | $(BH_{max})\times 10^{16}$, gauss-oersted | Remarks |
|---|---|---|
| Fe+Ni (20–50%) | 0.0005 to 0.0008 | High permeability, annealed, may be electroplated |
| Ferrite | 0.1 to 5 | Readily molded or embedded |
| Fe+0.6% C | 0.18 | Plain carbon steel |
| Fe+35% Co | 0.96 | A special magnet steel |
| Alinco | 1.6 | Powder metallurgy, permanent magnets |
| Triconal GX | 7.5 | |
| Pt–Co alloy | 4 or greater | |
| Pt–Co intermetallic compound in ordered state | ≈10 | |

The application filed concurrently herewith, referred to above, sets forth several techniques for, and structural arrangements incorporating magnetic material within semiconductor devices. These may be likewise applied to accomplish the principles of this invention. In summary, the incorporation of magnetic means within the substrate or mounting boards as described above in connection with this invention may be accomplished in several ways. Hard magnetic material suitable for permanent magnetization or soft material for use with an external magnetomotive force may be provided in the desired locations on the circuit board by a separate metallization step utilizing a mask distinct to the required magnetic pattern. Following deposition, hard material may be magnetized as desired using magnetic heads arranged in the form of a jig or the like. Alternatively, the magnetic material may be deposited over the entire face of the circuit board and unwanted portions removed using a mask.

Inasmuch as the semiconductor devices being positioned in accordance with this invention are of extremely small mass, electrostatic forces may be sufficient to affect them. As is known in the art, such unwanted electrostatic charge which may accumulate may be removed by particle radiation or X-rays In some instances it may be practicable to use electrostatic forces to retain or suspend elements during the assembly process. Further, as mentioned above, a superimposed alternating magnetic field may be used to overcome surface friction effects and produce optimal alignment. Thus, although the practice of this invention is primarily realizable by use of magnetic spin polarizable material it may be possible to utilize materials subject to polarization by other means such as electrostatic.

In connection with use of magnetic means for placing elements on apparatus boards, in general the desired placement is designed to coincide with the energy minima, recognizing that in a magnetic system the energy seeks to be minimized. Thus, in effect, gaps in the magnetic circuits may be arranged so that "centering" of elements automatically occurs. For example, the shape and disposition of the magnetic members in the mounting board, in effect, may frame or surround the magnetic material which completes the magnetic circuit in the semiconductor devices. This aspect is important in obtaining optimal location of devices under manufacturing conditions.

From the foregoing description it will be appreciated that the enhanced assembly techniques provided by the incorporation of magnetic means within mounting boards and semiconductor devices to be mounted thereon will enable assembly with simply a coarse feeding of the devices to the board surface. Fabrication means for assembly may be utilized to provide movement of semiconductor devices upon the board surfaces to enable exact location by magnetic means. Moreover, the cooperating magnetic effect may be affixed both by providing permanent magnetic means within the circuit board and the semiconductor device as well as by utilizing permanent means only within the circuit board.

Moreover, although reference herein has been particularly to semiconductor devices, other electronic elements which are mounted in similar fashion on circuit boards may likewise be used in the practice of the invention. For example, semiconductor elements are fabricated to contain only resistance elements or capacitors.

Accordingly, although the invention has been described in terms of particular embodiments it will be understood that variations may be devised by those skilled in the art which likewise will fall within the scope and spirit of the invention.

What is claimed is:

1. Electronic apparatus comprising a mounting board and a beam lead semiconductor element mounted thereon, said mounting board comprising a layer of dielectric material, a conductive metal circuit pattern on the surface of said dielectric layer, said conductive circuit pattern having terminal portions, a plurality of said terminal portions selected in accordance with an asymmetrical pattern having permanent ferromagnetic material included therein, a beam lead semiconductor device affixed to said mounting board by said terminal portions and said beam leads, wherein those beam leads affixed to said selected terminal portions containing ferromagnetic material likewise contain ferromagnetic material, whereby said semiconductor device is capable of being affixed in only one orientation.